(12) United States Patent
Wu et al.

(10) Patent No.: US 7,864,518 B2
(45) Date of Patent: Jan. 4, 2011

(54) COMPUTER ENCLOSURE

(75) Inventors: Chia-Kang Wu, Taipei Hsien (TW);
Lung-Sheng Tsai, Taipei Hsien (TW);
Li-Ping Chen, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 310 days.

(21) Appl. No.: 12/118,759

(22) Filed: May 12, 2008

(65) Prior Publication Data
US 2009/0244862 A1 Oct. 1, 2009

(30) Foreign Application Priority Data
Mar. 27, 2008 (CN) .................... 2008 2 0300453 U

(51) Int. Cl.
*G06F 1/16* (2006.01)
(52) U.S. Cl. .................. 361/679.32; 361/759; 361/816; 312/223.1; 312/223.2; 292/202; 292/209
(58) Field of Classification Search .................. 361/726
See application file for complete search history.

(56) References Cited
U.S. PATENT DOCUMENTS

| | | | | |
|---|---|---|---|---|
| 5,601,349 A * | 2/1997 | Holt | ......................... | 312/265.6 |
| 5,673,175 A * | 9/1997 | Carney et al. | .......... | 361/679.58 |
| 6,366,470 B1 * | 4/2002 | Goessel et al. | .............. | 361/796 |
| 6,603,666 B2 | 8/2003 | Chen | | |
| 6,693,800 B1 * | 2/2004 | Lin et al. | ..................... | 361/759 |
| 6,809,922 B2 * | 10/2004 | Lin et al. | .................. | 361/679.4 |
| 6,834,766 B2 * | 12/2004 | Lin et al. | .................. | 211/41.17 |
| 6,950,313 B1 * | 9/2005 | Shih | ........................... | 361/759 |
| 6,960,720 B2 * | 11/2005 | Wen-Lung | .................. | 174/50 |
| 7,054,164 B2 * | 5/2006 | Shih-Tsung | ................. | 361/801 |
| 7,289,318 B2 * | 10/2007 | Hsiao | .................... | 361/679.41 |
| 7,561,441 B1 * | 7/2009 | Chang | ........................ | 361/801 |
| 7,564,696 B1 * | 7/2009 | Winick et al. | ............... | 361/801 |
| 2004/0022033 A1 * | 2/2004 | Hsu | ........................... | 361/726 |
| 2004/0037048 A1 * | 2/2004 | Liao | ........................... | 361/726 |
| 2005/0128716 A1 * | 6/2005 | Holt et al. | .................... | 361/726 |
| 2006/0018101 A1 * | 1/2006 | Huang | ........................ | 361/726 |
| 2007/0064382 A1 * | 3/2007 | Hsiao | ........................ | 361/685 |
| 2007/0242442 A1 * | 10/2007 | Dai | ............................. | 361/801 |

* cited by examiner

*Primary Examiner*—Jayprakash N Gandhi
*Assistant Examiner*—Anthony Q Edwards
(74) *Attorney, Agent, or Firm*—Frank R. Niranjan

(57) ABSTRACT

The invention is related to a computer enclosure. The computer enclosure includes a chassis, an expansion card, and a rotating member. The expansion card includes a shield plate which has a bent end formed thereon. The chassis includes a sidewall. A slot is defined in the sidewall. The sidewall forms a support plate at a side of the slot. The sidewall is capable of accepting the shield plate of the expansion card to shield the slot of the sidewall, and the support plate is configured to accepting the bent end of the expansion card. The rotating member includes an arm. The rotating member is capable of rotating on the sidewall to a locked position. In the locked position, the arm is capable of exerting force on the bent end of the expansion card located on the support plate, and the locked position is capable of securing the expansion card on the sidewall of the chassis.

15 Claims, 6 Drawing Sheets

COMPUTER ENCLOSURE

BACKGROUND

1. Technical Field

The present invention relates to computer enclosures, and more particularly to a computer enclosure which can conveniently mount expansion cards therein.

2. Description of Related Art

Microprocessor based computer systems typically require or include facilities for connecting one or more expansion cards to the system. Expansion cards extend the capabilities of computer systems by providing dedicated hardware to achieve a variety of tasks. Graphics adapters, high speed network controllers, hard disk controllers, sound cards, and modem cards are among some of the more common types of expansion cards, although those knowledgeable in the field of computer systems will recognize a wide variety of other types of expansion cards.

Typically, expansion cards are interfaced with the microprocessor (or microprocessors in a multi-processor system) by physically inserting the expansion card into an expansion card connector. In many cases, the expansion card comprises facilities for making an external connection to the expansion card. A network adapter card, for example, typically comprises a socket for connecting an external cable to the adapter card. The expansion card must be maintained in a precise position such that the socket is accessible. Moreover, because external connections to expansion cards are achieved by incorporating expansion slots in an enclosure of a computer system, it is important to maintain the positioning of expansion cards within their respective expansion card connectors during system operation to ensure operational reliability. Thus, maintaining precise positioning of expansion cards is an important issue in the design and manufacturing of computer systems. Historically, the secure positioning of expansion cards has been maintained by screwing each expansion card into place with one or more securing screws. Unfortunately, the use of multiple screws to secure each expansion card undesirably increases the amount of time and effort required to install, remove, replace, and otherwise service the expansion cards in a system.

What is needed, therefore, is a computer enclosure for the convenient installation and removal of an expansion card therein and therefrom.

SUMMARY

A computer enclosure includes a chassis, an expansion card, and a rotating member. The expansion card includes a shield plate which has a bent end formed thereon. The chassis includes a sidewall. A slot is defined in the sidewall. The sidewall forms a support plate at a side of the slot. The sidewall is capable of accepting the shield plate of the expansion card to shield the slot of the sidewall, and the support plate is configured to accepting the bent end of the expansion card. The rotating member includes an arm. The rotating member is capable of rotating on the sidewall to a locked position. In the locked position, the arm is capable of exerting force on the bent end of the expansion card located on the support plate, and the locked position is capable of securing the expansion card on the sidewall of the chassis.

Other advantages and novel features of the present invention will become more apparent from the following detailed description of preferred embodiment when taken in conjunction with the accompanying drawings, in which:

DETAILED DESCRIPTION OF THE INVENTION

Figure 1:
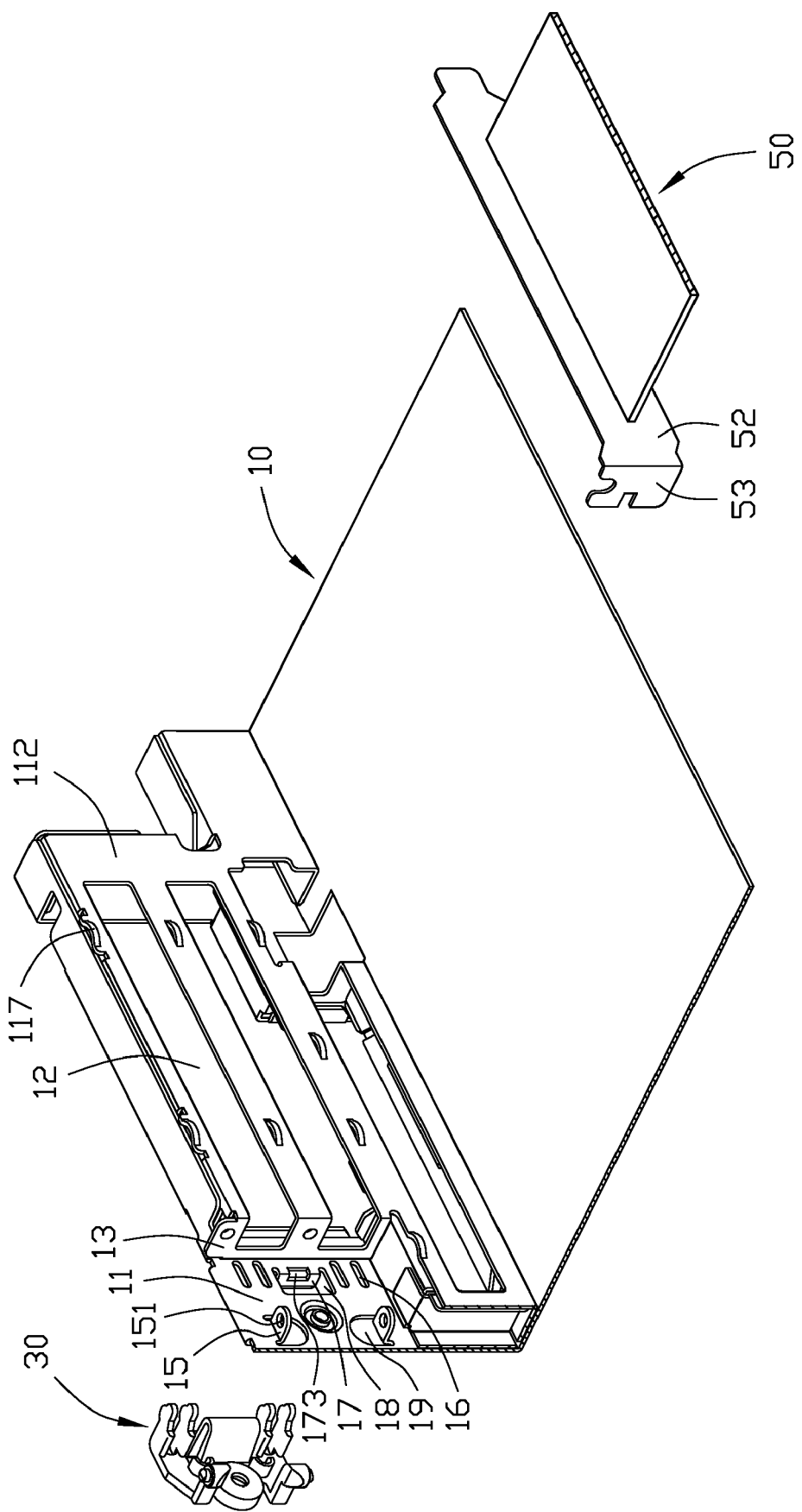
FIG. 1 is an exploded, isometric view of a computer enclosure, which includes a chassis, an expansion card and a rotating member.
Figure 2:
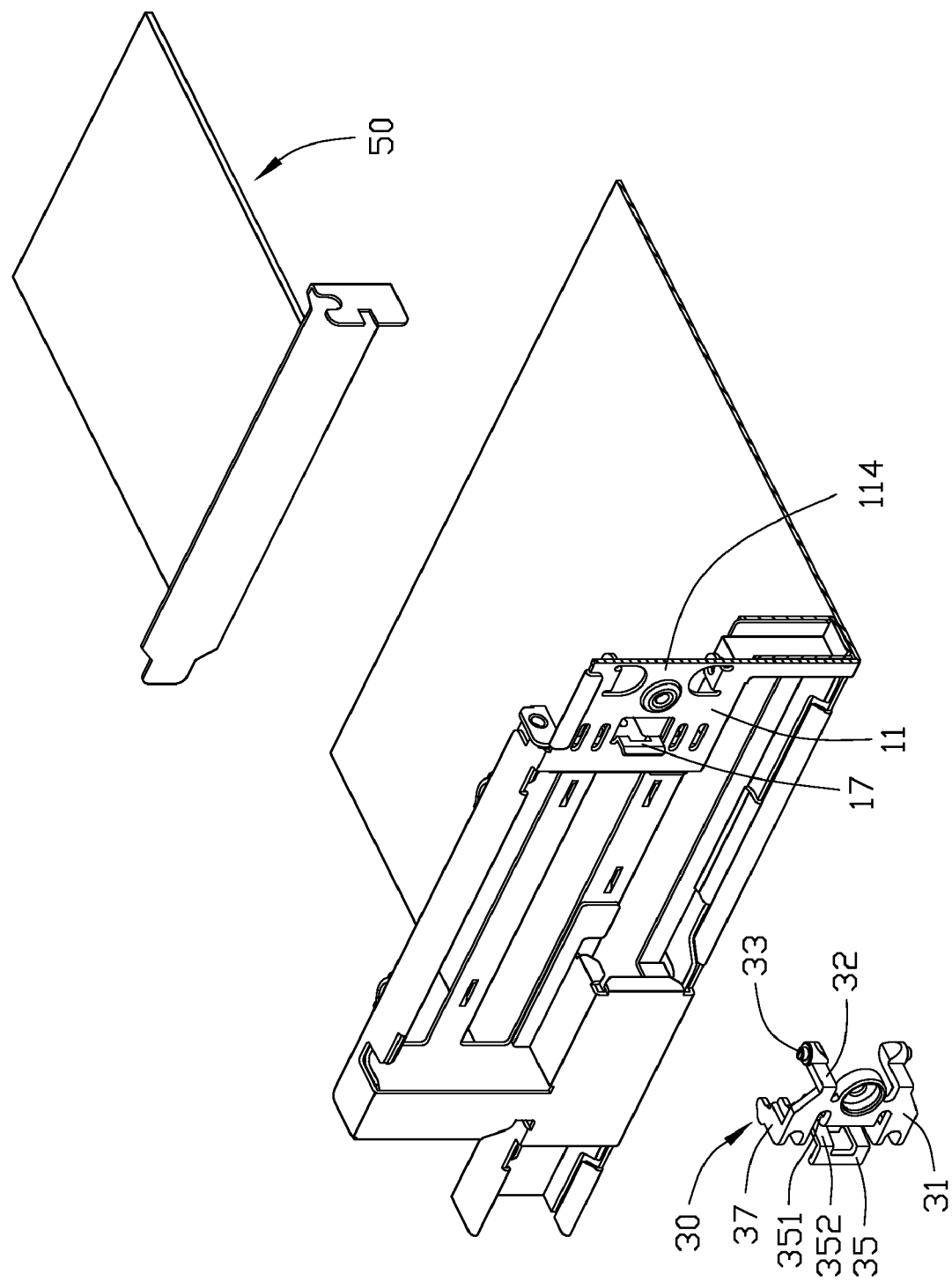
FIG. 2 is similar to FIG. 1, but viewed from another aspect.

Referring to FIGS. 1 and 2, a computer enclosure in accordance with an exemplary embodiment of the present invention is shown. The computer enclosure includes a chassis 10, an expansion card 50, and a rotating member 30.

The chassis 10 includes a sidewall 11, which includes an inner side 112 and an outside 114. A pair of horizontal slots 12 is defined in the sidewall 11. The sidewall 11 forms a plurality of positioning tabs 117 on opposite edges of each slot 12. A support plate 13 is formed at a left side of the slots 12. The sidewall 11 defines a pair of slits 16 corresponding to each of the slots 12. The slits 16 are defined on a left side of the support plate 13. A portion of the sidewall 11, which is located between the two pairs of slits 16, is punched outwardly to define an opening 18 and forms a resisting piece 17 perpendicular to the sidewall 11. An engaging hole 173 is defined at a connection portion of the resisting piece 17 and the sidewall 11. The sidewall 11 forms a pair of ear pieces 15 on the inner side 112, and defines a cutout 19 adjacent to each ear piece 15. Each ear piece 15 defines a pivot hole 151 therein.

The expansion card 50 includes a shield plate 52 corresponding to the slot 12 of the sidewall 11. The shield plate 52 forms a bent end 53 perpendicular to the shield plate 52 adapted for placement on the support plate 13.

Figure 3:
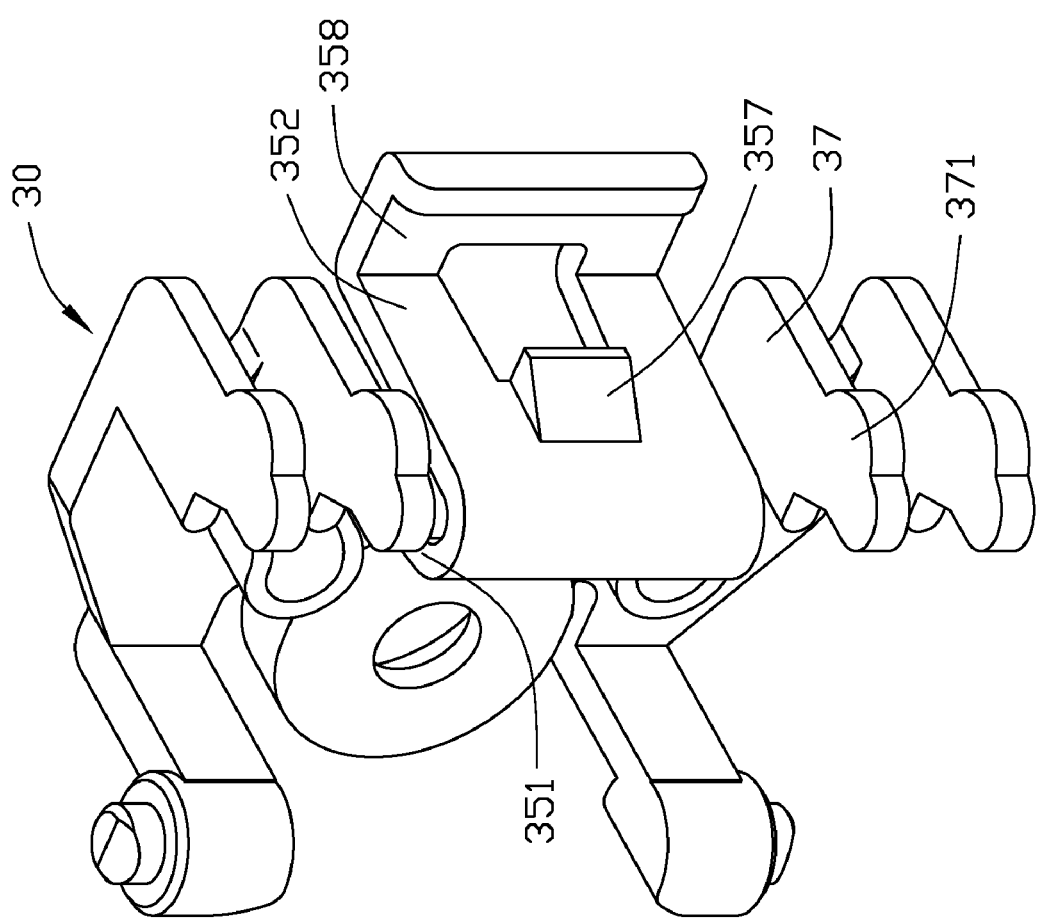
FIG. 3 is an isometric view of the rotating member of FIG. 1.

Referring to FIGS. 2 and 3, the rotating member 30 includes a base 31. A pair of legs 32 extends perpendicularly from one end of the base 31 corresponding to the cutouts 19 of the sidewall 11. Each leg 32 forms a pivot 33 thereon. Two pairs of arms 37 extend perpendicularly from the other end of the base 31 corresponding to the slits 16 of the sidewall 11. Each arm 37 forms an arc-shaped protrusion 371 thereon. The legs 32 and the arms 37 extend in a same direction. An "n"-shaped elastic piece 35 is formed from the base 31, and located between the two pairs of arms 37. The elastic piece 35 includes a first piece 351 connected with the base 31 and extending from the base 31 in a same direction as that of the arms 37, and a second piece 352 extending from a free end of the first piece 351 in a reverse direction relative to the extending direction of the first piece 351. A distance is defined between the first piece 351 and the second piece 352. A clip block 357 is formed on a side of the second piece 352, which is facing away from the first piece 351. A free end of the second piece 352 is bent to form an operating portion 358.

Figure 4:
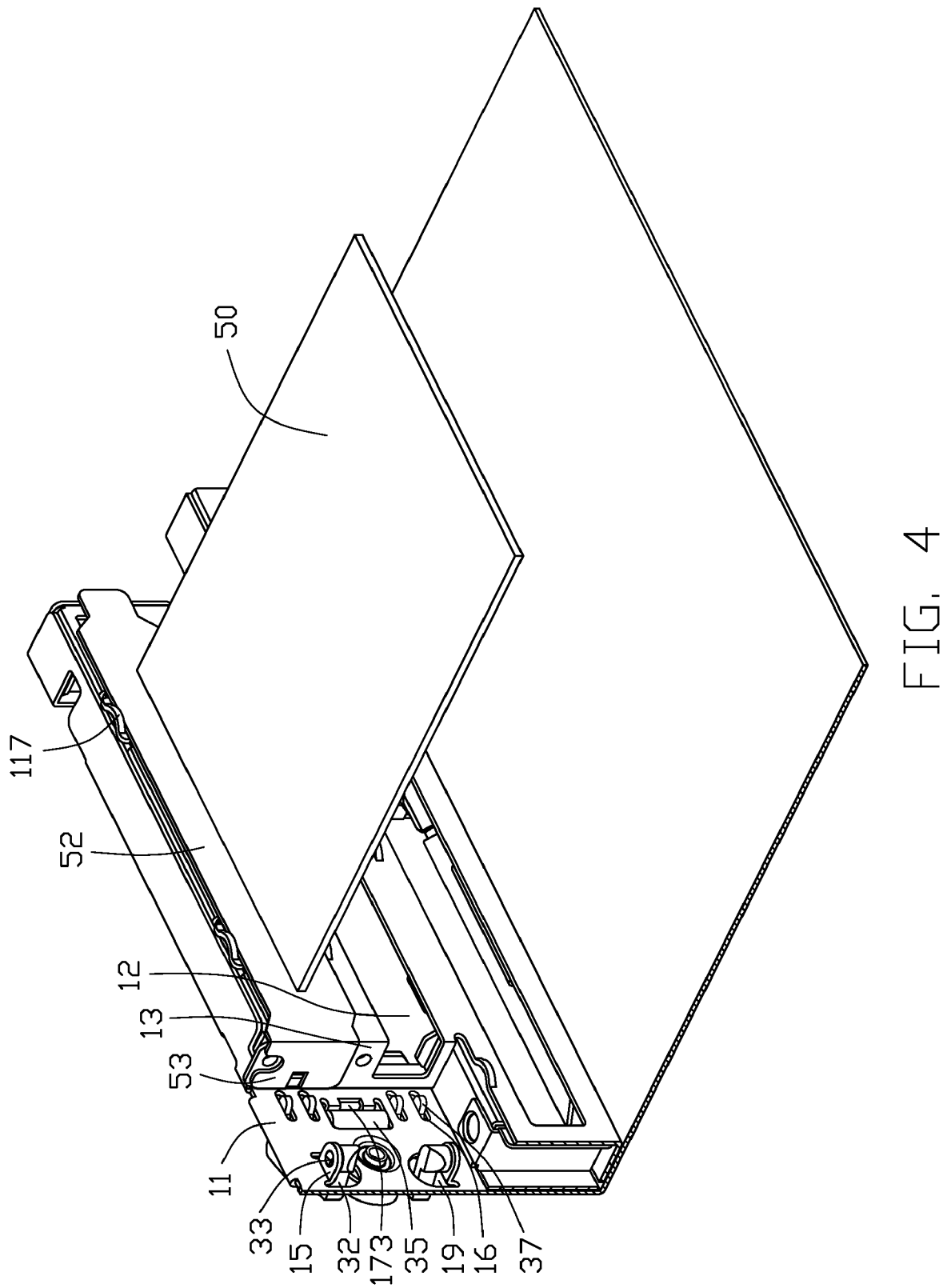
FIG. 4 is an assembly view of FIG. 1, before the rotating member is rotated to engage the expansion card on the chassis.
Figure 5:
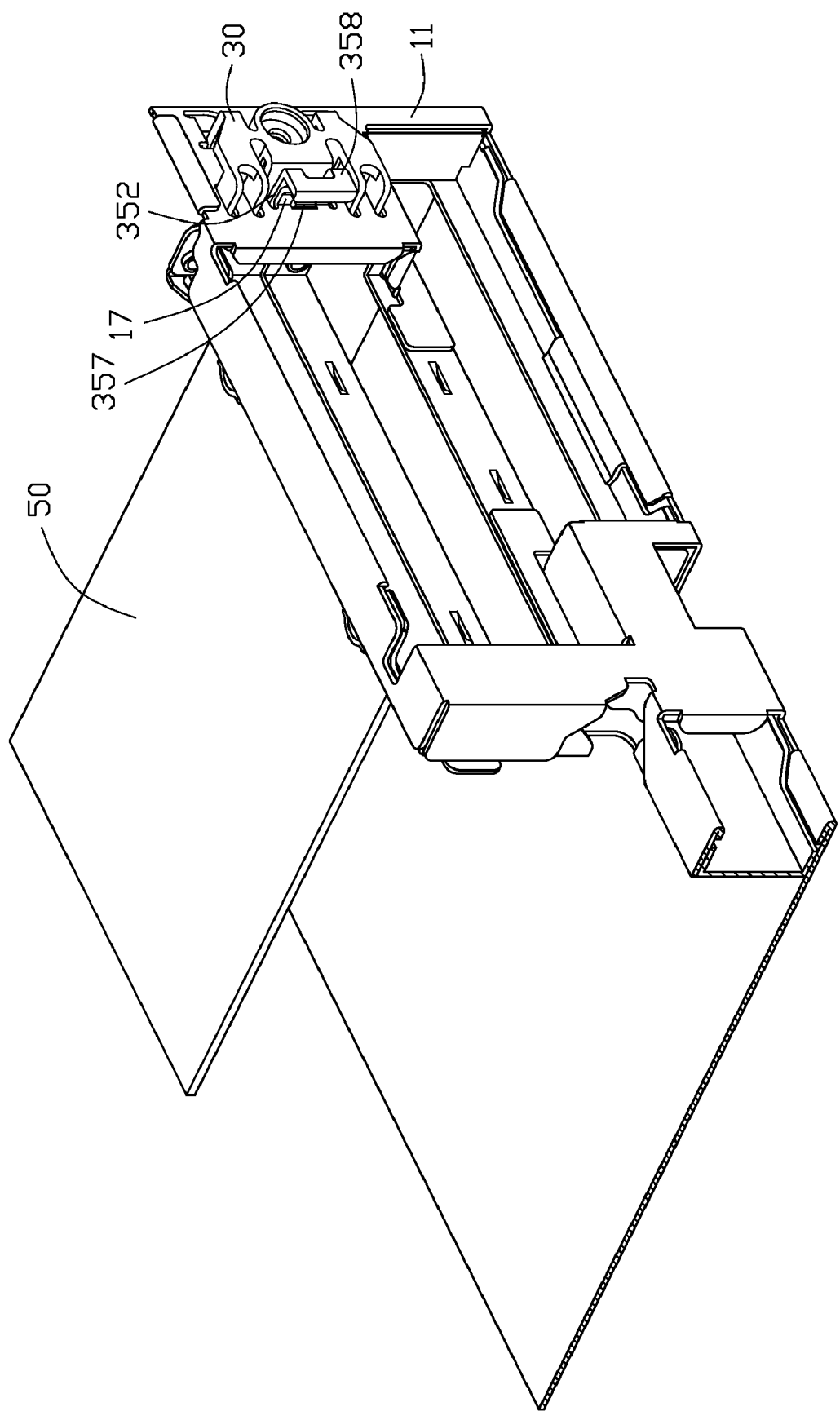
FIG. 5 is another assembly view of FIG. 1, showing the rotating member rotated to engage the expansion card on the chassis.
Figure 6:
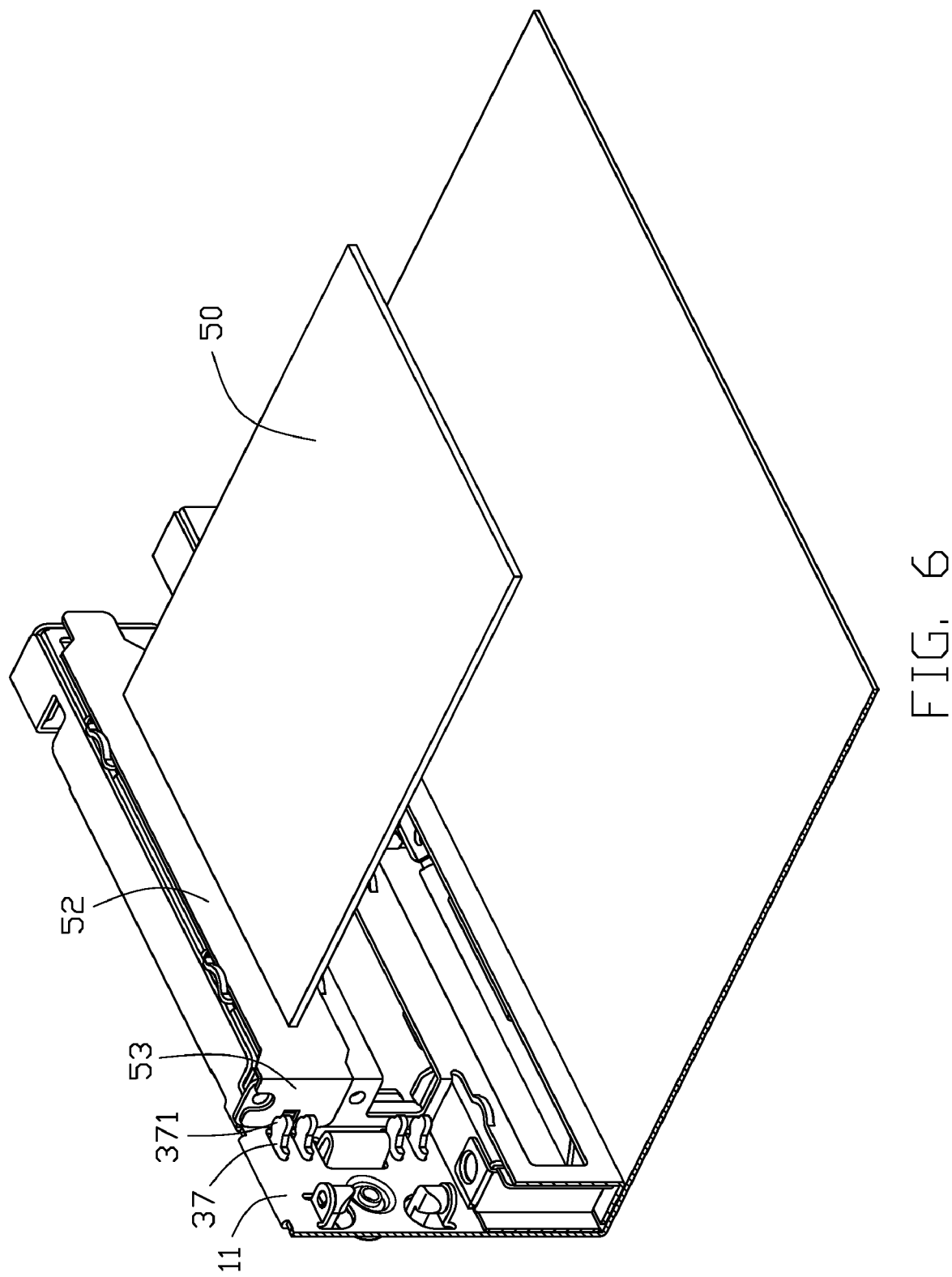
FIG. 6 is similar to FIG. 5, but viewed from another aspect.

Referring to FIGS. 4, 5, and 6, in assembly, the pair of legs 32 extend through the cutouts 19 from the outside 114 of the sidewall 11. The pivots 33 of the legs 32 are inserted into the pivot holes 151 of the ear pieces 15 to pivotably mount the rotating member 30 on the sidewall 11. The shield plate 52 of the expansion card 50 is placed on the sidewall 11 to shield one slot 12, and positioned between the positioning tabs 117 of the sidewall 11. The bent end 53 of the shield plate 52 is located on the support plate 13 of the sidewall 11.

Next, the rotating member 30 rotates towards the sidewall 11. The arms 37 of the rotating member 30 are aligned with and inserted into the slits 16 of the sidewall 11. The elastic piece 35 of the rotating member 30 is aligned with and inserted into the opening 18 of the sidewall 11. The clip block 357 resists against the resisting piece 17 when the rotating member 30 is rotating. The second piece 352 of the elastic piece 35 is bent by the force of the resisting piece 17 resisting the clip block 357. The rotating member 30 rotates until the clip block 357 is aligned with the engaging hole 173 of the resisting piece 17. At this alignment position, the resisting piece 17 no longer resists the clip block 357. The second piece 352 is released to a relaxed state to engage the clip block 357 in the engaging hole 173. Thus, the rotating member 30 is locked on the sidewall 11 at this engagement position. At this locked position, the protrusions 371 of the arms 37 press the bent end 53 of the expansion card 50 on the support plate 13 to firmly secure the expansion card 50 on the sidewall 11.

When disassembling the expansion card 50 from the sidewall 11, the operating portion 358 of the elastic piece 35 is pulled to bend the second piece 352. The clip block 357 of the second piece 352 is moved away from the engaging hole 173. Next, the rotating member 30 rotated. The elastic piece 35 is moved from the opening 18 and the arms 37 are moved from the slits 16. Subsequently, the protrusions 371 of the arms 37 no longer press the bent end 53. Finally, the expansion card 50 can be detached from the sidewall 11.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A computer enclosure, comprising:
an expansion card comprising a shield plate, the shield plate forming a bent end thereon;
a chassis comprising a sidewall, a slot defined in the sidewall, the sidewall forming a support plate at a side of the slot, the sidewall is capable of accepting the shield plate of the expansion card to shield the slot of the sidewall, and the support plate is configured to accept the bent end of the shield plate; and
a rotating member comprising an arm, the rotating member is capable of rotating on the sidewall to a locked position, in the locked position the arm is capable of exerting force on the bent end of the shield plate located on the support plate, the locked position is capable of securing the expansion card on the sidewall of the chassis;
wherein the sidewall defines an engaging hole, and the rotating member comprises a clip block, the clip block engages into the engaging hole to lock the rotating member in the locked position wherein the rotating member comprises an elastic piece on which the clip block is formed, the sidewall comprises a resisting piece perpendicular to the side wall, the resisting piece is capable of providing resistance to the elastic piece and bending the elastic piece when the rotating member is rotating from a non locked position to the locked position, and the engaging hole is defined at a connection portion of the resisting piece and the sidewall.

2. The computer enclosure as described in claim 1, wherein the arm forms an arc-shaped protrusion that is capable of exerting force in the locked position.

3. The computer enclosure as described in claim 1, wherein the elastic piece comprises a first piece extending in a first direction and a second piece extending from a free end of the first piece in a reversed direction of the first direction, a distance is defined between the first piece and the second piece, and the clip block is formed on a side of the second piece which faces the resisting piece.

4. The computer enclosure as described in claim 1, wherein the rotating member comprises a pair of legs, each leg forms an pivot thereon, the sidewall forms a pair of ear pieces, each ear piece defines a pivot hole adapted to receive the pivot inserted therein to pivotally mount the rotating member on the sidewall.

5. The computer enclosure as described in claim 4, wherein the sidewall comprises an inner side and an outside, the ear piece is formed on the inner side of the sidewall, the sidewall defines a cutout adjacent each of the pair of the ear piece, the legs of the rotating member extend through the cutouts from the outside of the sidewall to be pivotally mounted on the ear pieces.

6. The computer enclosure as described in claim 5, wherein the sidewall defines a slit adapted for the arm of the rotating member extending therethrough to exert force on the bent end.

7. The computer enclosure as described in claim 1, wherein the sidewall forms one or more positioning tabs located on each side of the slot, wherein the tabs located on either side of the slot are able to position the shield plate of the expansion card therebetween.

8. A computer enclosure, comprising:
an expansion card comprising a shield plate;
a chassis comprising a sidewall which defines a slot and an engaging hole, the sidewall is capable of accepting the shield plate of the expansion card to shield the slot of the sidewall;
a rotating member comprising an arm and a clip block, the rotating member is capable of rotating on the sidewall to have the clip block engaging into the engaging hole to lock the rotating member at a locked position where the arm exerts force on the shield plate on the sidewall to secure the expansion card on the sidewall wherein the rotating member comprises an elastic piece on which the clip block is formed, the sidewall comprises a resisting piece perpendicular to the side wall, the resisting piece is capable of providing resistance to the elastic piece and bending the elastic piece when the rotating member is rotating from a non locked position to the locked position, and the engaging hole is defined at a connection portion of the resisting piece and the sidewall.

9. The computer enclosure as described in claim 8, wherein the shield plate forms a bent end perpendicular to the shield plate, the sidewall forms a support plate at a side of the slot, the bent end is capable of located on the support plate when the shield plate is located on the sidewall, and the arm is capable of exerting force on the bent end of the shield plate.

10. The computer enclosure as described in claim 9, wherein the arm forms an arc-shaped protrusion that is capable of exerting force in the locked position.

11. The computer enclosure as described in claim 8, wherein the elastic piece comprises a first piece extending in a first direction and a second piece extending from a free end of the first piece in a reversed direction of the first direction, a distance is defined between the first piece and the second piece, and the clip block is formed on a side of the second piece which faces to the resisting piece.

12. The computer enclosure as described in claim 8, wherein the rotating member comprises a pair of legs, each leg forms an pivot thereon, the sidewall forms a pair of ear pieces, each ear piece defines a pivot hole adapted to receive the pivot inserted therein to pivotably mount the rotating member on the sidewall.

13. The computer enclosure as described in claim 12, wherein the sidewall comprise an inner side and an outside, the ear piece is formed on the inner side of the sidewall, the sidewall defines a cutout adjacent each of the pair of the ear piece, the legs of the rotating member extend through the cutouts from the outside of the sidewall to be pivotably mounted on the ear pieces.

14. The computer enclosure as described in claim 13, wherein the sidewall defines a slit adapted for the arm of the rotating member extending therethrough to exert force on the shield plate.

15. The computer enclosure as described in claim 8, wherein the sidewall forms one or more positioning tabs located on each side of the slot, wherein the tabs located on either side of the slot are able to position the shield plate of the expansion card therebetween.

* * * * *